United States Patent
Roeder et al.

(10) Patent No.: US 6,284,654 B1
(45) Date of Patent: Sep. 4, 2001

(54) CHEMICAL VAPOR DEPOSITION PROCESS FOR FABRICATION OF HYBRID ELECTRODES

(75) Inventors: Jeffrey F. Roeder, Brookfield; Thomas H. Baum, New Fairfield; Peter C. Van Buskirk, Newtown, all of CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/061,380

(22) Filed: Apr. 16, 1998

(51) Int. Cl.[7] .................................................. H01L 21/44
(52) U.S. Cl. ............................ 438/681; 438/3; 438/240; 438/396; 438/680; 438/685; 438/686
(58) Field of Search ................................ 438/3, 240, 396, 438/573, 580, 680, 681, 685, 686, 761, FOR 337, FOR 349; 257/295

(56) References Cited

U.S. PATENT DOCUMENTS

| | | |
|---|---|---|
| 5,096,737 | 3/1992 | Baum et al. . |
| 5,130,172 | 7/1992 | Hicks et al. . |
| 5,142,437 * | 8/1992 | Kammerdiner et al. ........... 361/321.1 |
| 5,204,314 * | 4/1993 | Kirlin et al. ......................... 505/447 |
| 5,225,561 | 7/1993 | Kirlin et al. . |
| 5,248,787 | 9/1993 | Timmer et al. . |
| 5,262,920 * | 11/1993 | Sakuma et al. .................... 361/321.5 |
| 5,270,298 | 12/1993 | Ramesh et al. . |
| 5,280,012 | 1/1994 | Kirlin et al. . |
| 5,376,409 | 12/1994 | Kaloyeros et al. . |
| 5,403,620 | 4/1995 | Kaesz et al. . |
| 5,527,567 * | 6/1996 | Desu et al. .......................... 427/573 |
| 5,536,323 | 7/1996 | Kirlin et al. . |
| 5,555,486 * | 9/1996 | Kingon et al. ...................... 257/295 |
| 5,619,393 | 4/1997 | Summerfelt et al. . |
| 5,629,229 * | 5/1997 | Si et al. .................................. 438/3 |
| 5,696,018 * | 12/1997 | Summerfelt et al. ................ 438/396 |
| 5,711,816 | 1/1998 | Kirlin et al. . |
| 5,783,716 * | 7/1998 | Baum et al. ......................... 556/136 |
| 5,840,897 * | 11/1998 | Kirlin et al. ............................ 546/2 |
| 5,902,639 * | 12/1999 | Glassman et al. ................ 427/248.1 |

FOREIGN PATENT DOCUMENTS

| | | |
|---|---|---|
| 370473 | 3/1923 | (DE) . |
| 0 058 571 | 8/1982 | (EP) . |
| 0 328 333 | 8/1989 | (EP) . |
| 0 405 634 A2 | 1/1991 | (EP) . |
| 58-125633 | 7/1983 | (JP) . |
| 1305813 | 12/1989 | (JP) . |
| WO 93/04072 | 3/1993 | (WO) . |

OTHER PUBLICATIONS

Al–Shareef, et al, *J. Appl. Phys.*, 77 (5), Mar. 1, 1995, p. 2146.

"Integrated Systems Approach on DLI," Bulletin LPDS—12/94, copyright 1994, MKS Instruments, Inc.

(List continued on next page.)

*Primary Examiner*—Carl Whitehead, Jr.
*Assistant Examiner*—Maria Guerrero
(74) *Attorney, Agent, or Firm*—Steven J. Hultquist; Oliver A. M. Zitzmann (57) ABSTRACT

A method of fabricating an electrode structure for a ferroelectric device structure including a ferroelectric material, involving chemical vapor deposition of a hybrid electrode constituting a multilayer electrode structure or an alloyed electrode structure, using either bubbler delivery or liquid delivery chemical vapor deposition.

22 Claims, 2 Drawing Sheets

OTHER PUBLICATIONS

"Direct Liquid Inject Sub–System—DLI–25B," Bulletin DLI–12/94, copyright 1994 MKS Instruments Inc.

Singh, R.K., et al, "In Situ Processing of Epitaxial Y–Ba–Cu–O High Tc Superconducting Films on (100) SrTiO$_3$ and (100) YS–ZrO$_2$ Substrates at 500–650° C,"App. Phys. Lett. 54 (22), May 29, 1989, pp. 2271–2273.

Yoshitake, T., et al, "As–Grown Superconducting Bi–S-r–Ca_Cu–O Thin Films by Co–evaporation," App. Phys. Lett. 55(7), Aug. 14, 1989, pp. 702–704.

Erbil, A., et al, "A Review of Metalorganic Chemical Vapor Deposition of High Temperature Superconducting Thim Films," SPIE vol. 1187 Processing of Films for High Tc Superconducting Electronics (1989), 115–127.

Kirlin, Peter S., et al, "Growth of High Tc YbaCuO Thin Films by Metalorgainc Chemical Vapor Deposition," SPIE, vol. 1187 SPIE vol. 1187 Processing of Films for High Tc Superconducting Electronics (1989), 115–127.

Zama, H., et al., "Properties of Metalorganic Precurors for Chemical Vapor Deposition of Oxide Superconductors ," Japanese Journal of Applied Physics, 29(7), Jul. 1990, pp. L1072–L1074.

Gardiner, R., et al, "Volatile Barium β–Diketonate Polyether Adducts. Synthesis, Characterization, and Metalorganic Chemical Vapor Deposition," Chem. Mater., 3(6), 1991, pp. 1053–1059.

Lackey, W.J., et al., "Rapid Chemical Vapor Deposition of Superconducting Yba$_2$Cu$_3$O$_x$," Appl. Phys. Lett. 56(12), Mar. 19, 1990, pp. 1175–1177.

Turnipseed, S.B., et al, "Synthesis and Characterization of Alkaline–Earth–Metal β–Diketonate Complexes Used as Precursors for Chemical Vapor Deposition of Thin Film Superconductors," Inorg. Chem. 1991, 30(6), 1164–1170.

Hiskes, R., et al, "Single Source Metalorganic Chemical Vaor Deposition of Low Microwave Surface Rsistance YBa$_2$Cu$_3$O$_7$," Appl. Phys. Lett. 59(5), Jul. 29, 1991, pp. 606–607.

Zhang, J., et al "Plasma Enhanced Metalorganic Chemical Vapor Deposition of Conductive Oxide Electrodes for Ferroelectric BaTi$_3$ Capacitors," Mat. Res. Soc. Symp. Proc., vol. 310, 1993, pp. 249–254.

Van Buskirk, P., et al, "MOCVD Growth of BaTi$_3$ in an 8" Single–Wafer CVD Reactor,"Proceedings of ISAF92, in press (1992), 3 pages.

Koplitz, Lynn Vogel et al.; "Laser–Driven Chemical Vapor Deposition of Platinum at Atmospheric Pressure and Room Temperature from CpPt(CH$_3$)$_3$," Appl. Phys. Lett. 53 (18), Oct. 31, 1988, pp. 1705–1707.

Chen, Yea–jer et al., "Low–Temperature Organometallic Chemical Vapor Deposition of Platinum," Appl. Phys. Lett. 53 (17), Oct. 24, 1988, pp. 1591–1592.

Xue, Ziling et al., "Organometallic Chemical Vapor Deposition of Platinum, Reaction Kinetics and Vapor Pressures of Precursors," Chem. Mater. 1992, 4, pp. 162–166.

Dryden, Neil H. et al., "Chemcial Vapor Deposition of Platinum: New Precurors and Their Properties," Chem. Mater. 1991, 3, pp. 677–685.

Xue, Ziling et al., "Characterization of (Methylcyclopentadienyl)trimethylplatinum and Low–Temperature Organometallic Chemical Vapor Deposition of Platinum Metal," J. Am. Chem. Soc., 1989, III, 8779–8784.

Zinn, Alfred A. et al., "Chemical Vapor Deposition of Platinum, Palladium and Nickel," chapter 7 of *The Chemistry of Metal CVD*, T. Kodas et al., editors, VCH PUblishers, New York, 1994, pp. 329–355.

Rand, M., "Chemical Vapor Deposition of Thin–Film Platinum", J. Electronchem. Soc., 1973, 120, p. 686.

Kumar, R., et al., "New Precursors for Chemical Vapour Deposition of Platinum and the Hydrogen Effect of CVD," Polyhedron, 1989, vol. 8, p. 551.

Leipoldt, et al., "Kinetics of the Substitution Reactions of—Diketonato–1,5–Cyclo–Octadieneiridium(I) Complexes with Derivatives of 1, 10–Phenanthroline and 2,2'–Dipyridyl," Journal of Organometallic Chemistry, 418, (1991), pp. 241–247.

Koteki, D.E. "A Review of High Dielectric materials for DRAM Capacitors," Integ. Ferroelectric, 16, pp. 1–19 (1997).

Jeon, et al, "Thermal Stability of Ir/Polycrystalline–Si Structure for Bottom Electrode of Integrated Ferroelectric Capacitors," Applied Phys. Letter, 71(4), pp. 467–469 (1997).

Williams, et al, "Etch Rates for Micromachining Processing," Journal of Microelectromechanical Systems, vol. 5, No. 4, Dec. 1996, pp. 256–269.

Vugts, et al, "Si/XeF$_2$ Etching–Temperature Dependence," J. Vac. Sci. Tech. A, 14(5), pp. 2766–2774 (1996).

Chang, F.I., et al, "Gas Phase Silicon Micromachining with Xenon Difluoride," Proceedings, 2671, pp. 117–128 (1995).

Bolotin, V. P.; Mikhailovskii, I. L.; Cherepov, E. I. Rate of Deposition of Phosphosilicate Glass Layers from a Silane–Oxygen–Trimethyl Phosphate Gas Phase in a Nonisothermal Reactor by Catalytic Chemical Vapor Deposition (Cat–CVD), in *Khim. Fiz.* 1993, 12, 268.

Satoshi, S.; Hasegawa, M.; Sodesawa, T.; Nozaki, F. "Silica–supported Boron Phosphate Catalyst Prepared by Chemical Vapor Deposition," in *Bull. Chem. Soc. Jpn. 1991*, pp. 64, 268.

Deschanvres, J. L.; Vaca, J. M.; Joubert, J. C. "Thin Films of Zirconia–Phosphate Glasses Deposited by an Aerosol CVD Process." in *J. Phys, IV 1995*, 5, C5/1029.

Basson, S.S. et al, "Bromide Catalysis in the Oxidative Addiiton of Iodomethane to Iridium(I) Complexes", Inorganic Chimica Acta, 1990, vol. 173, pp. 155–158.

Chen, T. et al, "Ir–Electroded BST Thin Film Capacitors for 1 Giga–bit DRAM Application", IEEE, 1996, vol. 96, pp. 679–682.

Takashi, N., "Preparation of Pb(Zr,Ti)O$_3$ Thin Films on Ir and IrO$_2$ Electrodes", Jpn. J. Appl. Phys. 1994, vol. 33, pp. 5211–5214.

Chen, T. et al, "Stability of Reactive DC–Sputtered Ir and IrO$_2$ Thin Films in Various Ambients", Integrated Ferroelectrics, 1997, vol. 16, pp. 191–198.

Cho, H–J, et al, "Preparation and Characterization of Iridium Oxide Thim Films by DC Reactive Sputttering", Extended Abstracts of the 1996 Int. Conf. On Solid State Devices and Materials, 1996, pp. 721–723.

Chen. T. et al, "Ir–Electroded BST Thin Films Capacitors for 1 Giga–bit DRAM Application", IEEE, 1996, vol. 96, pp. 679–682.

Takashi, N., et al, "Preparation of Pb(Zr,Ti)O$_3$ Thin Films on Ir IrO$_2$ Electrodes", Jpn. J. Appl. Phys. 1994, vol. 33, pp. 5211–5214.

Chen, T. et al, "Stability of Reactive DC–Sputtering Ir and IrO$_2$ Thin Films in Various Ambients", Integrated Ferroelectrics, 1997, vol. 16, pp. 191–198.

Cho, H–J. et al, "Preparation and Characterization of Iridium Oxide Thin Films by DC Reactive Sputtering", Extended Abstracts of the 1996 Int. Conf. On Solid State Devices and Materials, 1996, pp. 721–723.

* cited by examiner

CHEMICAL VAPOR DEPOSITION PROCESS FOR FABRICATION OF HYBRID ELECTRODES

BACKGROUND OF THE INVENTION

1. Field of the Invention

This invention relates generally to a chemical vapor deposition (CVD) process for the fabrication of hybrid electrodes in microelectronic device structures such as ferroelectric random access memory (FeRAM) device structures.

2. Description of the Related Art

Ferroelectric random access memories (FeRAMs) depend on the use of high integrity ferroelectric materials as a critical component of cell architecture. Although a wide variety of ferroelectric materials have been developed having actual demonstrated and potential utility in device applications, the practical utilization of such materials in device architectures requires that such materials can be readily fabricated in an efficient and cost-effective manner with respect to their integration in conformations including barrier regions, isolation structures, interconnects, vias and electrodes.

The electrical properties of ferroelectric materials in many instances are highly influenced by the materials used to fabricate electrodes for the ferroelectric material structures. For example, ferroelectric materials such as $Pb(Zr,Ti)O_3$ (PZT) show a strong dependence on the type of electrode used as the contact for the device structure.

Noble metals such as platinum that have a high work function may be used to fabricate electrodes that produce device structures with low electrical leakage characteristics, but the rate of loss of remanent polarization in the structure with repeated switching cycles (ferroelectric fatigue) is unacceptably high.

Conversely, conductive oxide electrodes improve fatigue behavior, but usually at the cost of unacceptably large increase in electrical leakage. Kingon, et. al., (U.S. Pat. No. 5,555,486) and Al-Shareef, et. al. (J. Appl. Phys. 77 (5), Mar. 1, 1995: 2146), the disclosures of which are hereby incorporated herein by reference in their entirety, have demonstrated a hybrid electrode, comprised of dual layers of Pt and conductive oxide, either with the Pt layers on the exterior or the conductive oxide layers on the exterior, and the other electrode material on the interior against the ferroelectric material. When used with such hybrid electrodes, PZT displays both good fatigue endurance and low electrical leakage.

The layered structures of the above-described art represent one approach to achieving the benefits of conductive oxides and Pt electrodes.

An alternative approach utilizes alloyed electrodes, also demonstrated by Kingon, et. al., (U.S. Pat. No. 5,555,486) and Al-Shareef, et. al. (J. Appl. Phys. 77 (5), Mar. 1, 1995: 2146). Alloyed electrodes of Pt and $RuO_2$ are formed by co-deposition of metals using ion-beam sputtering. In the preferred embodiment the noble metal is alloyed with an element that is relatively immiscible, and that has a tendency to oxidize to an electrically conductive oxide. Examples of such a combination include Pt and Ir where Ir can be oxidized to $IrO_2$. Other examples of alloy systems with a high degree of immiscibility include Pd—Ir, Rh—Ir and Pd—Ru. In the latter example, Ru oxidizes to $RuO_2$. Still further examples include mixtures of noble metals (e.g., Pt, Pd, Rh) and complex conductive oxides ($LaSrCoO_3$, $SrRuO_3$, indium tin oxide, and yttrium barium copper oxide). The bi-phasic microstructure consists ideally of noble metal and oxidizable metal grains uniformly distributed. The oxidizable phase may be oxidized during the co-deposition process as taught by Kingon, et. al., and Al-Shareef, et. al., by a separate anneal in an oxidizing ambient (e.g., $O_2$, $N_2O$, ozone) before deposition of the ferroelectric, or alternatively, during the deposition process for the ferroelectric which is usually carried out in an oxidizing ambient.

As device density increases, a need arises for conformal coatings to cover sidewalls and to fill small features with electrodes. Wet methods of deposition are have poor conformality, as do line of sight processes such as evaporation. Sputter deposition offers a higher degree of conformality, but composition control of complex oxides is difficult.

Accordingly, there is a need in the art for improved electrode fabrication techniques to maximize the benefits achievable with composite electrode structures.

SUMMARY OF THE INVENTION

The present invention relates to a method of fabricating a hybrid electrode structure for a ferroelectric device structure including a ferroelectric material, comprising the steps of:

vaporizing a first organometallic precursor for a first electrode metal component to form a first electrode component precursor vapor, vaporizing a second organometallic precursor for a second electrode metal component to form a second electrode component precursor vapor; and depositing the first electrode component precursor vapor and the second electrode component precursor vapor by chemical vapor deposition for formation of said hybrid electrode structure, in a deposition mode selected from the group consisting of:

(I) simultaneous chemical vapor deposition of the first electrode metal component from the first electrode component precursor vapor and the second electrode metal component from the second electrode component precursor vapor, to yield an alloy hybrid electrode structure; and (II) sequential chemical vapor deposition of the first electrode metal component from the first electrode component precursor vapor and the second electrode metal component from the second electrode component precursor vapor, to yield a layered hybrid electrode structure including a first layer containing the first electrode metal component and a second layer containing the second electrode metal component.

The ferroelectric material utilized in the broad practice of the invention may comprise any suitable ferroelectric material, such as for example $Pb(Zr,Ti)O_3$, $(Pb,La)TiO_3$, $(Pb,La)(Zr,Ti)O_3$, $(Pb,Sr)(Zr,Ti)O_3$ and $SrBi_2(Ta,Nb)_2O_9$.

In one aspect of the method of the invention, the first organometallic and second organometallic precursors are different from one another and are selected from the group consisting of:

Platinum precursors trimethyl(cyclopentadienyl) Pt (IV), trimethyl(β-diketonate) Pt (IV), bis(β-diketonate) Pt (II), tetrakis(trfluorophosphine) Pt (0);

Cobalt: β-diketonates, cyclopentadienyl compounds, β-ketoiminates and β-diiminates of Co (II);

Iridium precursors: a Lewis base-stabilized β-diketonate iridium composition or a Lewis base-stabilized β-ketoiminate composition, of the formulae:

Lewis base stabilized Ir(I) β-diketonates of formula I:

I where in R and R' are the same or different and may be H, aryl, pertfluoroaryl, $C_1$–$C_6$ alkyl, or $C_1$–$C_6$ perfluoroalkyl, and L is a coordinating Lewis base, preferably alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane, or Lewis base stabilized Ir(I) β-ketoiminates of formula II:

II wherein R, R', and R" are the same or different, and are independently selected from the group consisting of H, aryl, perfluoroaryl, $C_1$–$C_6$ alkyl, or $C_1$–$C_6$ perfluoroalkyl, and L is a coordinating Lewis base, preferably selected from the group consisting of alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane;

Ruthenium precursors bis(cyclopentadienyl) Ru and tris(tetramethyl-3,5-heptanedionate) Ru;

Lanthanum: β-diketonates, cyclopentadienyl compounds, β-ketoiminates and β-diiminates of La(III);

Strontium: β-diketonates, cyclopentadienyl compounds, β-ketoiminates and β-diiminates of Sr (II); and Cobalt: β-diketonates, cyclopentadienyl compounds, β-ketoiminates and β-diiminates of Co (II);

Rhodium: Rhodium(I) β-diketonates.

In one preferred embodiment, the first electrode metal component and the second electrode metal component are selected from the group consisting of the following first and second metal pairs:

(i) Pt and Ir, (ii) Pt and Ru, (iii) Pd and Ir, (iv) Pd and Ru, (v) Rh and Ir, and (vi) Rh and Ru.

In another aspect, the present invention relates to a ferroelectric device structure, comprising a ferroelectric material, having conformally deposited thereon by chemical vapor deposition a hybrid electrode structure, which may be a layered hybrid electrode structure or an alloy hybrid electrode structure.

In the broad method of the invention, the hybrid electrode structure may be formed on a ferroelectric material, such as a ferroelectric film, to form a top electrode thereon.

Alternatively, the hybrid electrode structure may be formed initially (e.g., on another substrate or deposition surface), prior to providing the ferroelectric material thereon, to form a bottom electrode structure.

As a still further alternative, both formation techniques may be sequentially employed to provide a ferroelectric device structure with both top and bottom electrodes.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The present invention is based on the use of chemical vapor deposition (CVD), the thin film deposition method which has the highest degree of conformality, as a technique for forming composite electrodes for ferroelectric device structures.

Materials, such as $Pb(Zr,Ti)O_3$, $(Pb,La)TiO_3$, $(Pb,La)(Zr,Ti)O_3$, $(Pb,Sr)(Zr,Ti)O_3$ and $SrBi_2Ta_2O_9$ may be used as the ferroelectric material.

The chemical vapor deposition method of the invention may be utilized for depositing layered hybrid electrodes, as well as for producing alloyed hybrid electrodes comprised of two relatively immiscible noble metals, e.g., (i) Pt and Ir, (ii) Pt and Ru, (iii) Rh and Ir, and (iv) Rh and Ru. Chemical vapor deposition provides a fabrication method affording superior control of electrode composition.

As discussed in the Background of the Invention section hereof, the prior art has proposed the use of composite electrodes for ferroelectric materials, but the art has purposely avoided the utilization of chemical vapor deposition as a fabrication technique for such electrodes. The reason for this is that the art has viewed the temperatures at which chemical vapor deposition is carried out to be inimical to the achievement of useful ferroelectric device structures. Surprisingly, however, we have found that chemical vapor deposition may be alternatively utilized with bubbler delivery or liquid delivery of precursor vapor, to form electrodes on the ferroelectric material, and provide a highly efficient ferroelectric device structure.

In some instances, it may be desirable to oxidize one or more metal components of the electrode structure, to form a corresponding metal oxide. The oxide may be a surface oxide layer or a fully oxidized metal throughout the bulk of the oxidizable metal film, as may for example be achieved by carrying out the deposition of the oxidizable metal in an oxidizing ambient environment.

As used herein, the term "oxidizing ambient environment" means an environment including oxygen-containing gas, such as oxygen, ozone, air, nitrogen oxide (NO), or the like. Such oxidizing atmosphere may be provided in a deposition chamber or reaction vessel in which the deposition is carried out, and enables the formation of a metal oxide on the substrate from an oxidizable metal component of the overall electrode structure. For example, the oxidizing ambient environment may be an ambient air environment, thereby simplifying the formation of the metal-containing electrode film on the substrate. Alternatively, the metal oxide electrode film may be formed in a post-deposition process from the CVD-deposited metal by treatment in an oxidizing environment.

The bubbler delivery MOCVD process of forming the electrode structure on the ferroelectric material may be carried out with appropriate temperature, pressure, flow rate and other process conditions being readily determinable without undue experimentation by those skilled in the art of MOCVD thin film deposition.

The liquid delivery MOCVD process of forming the electrode structure on the ferroelectric material may be carried out in accordance with the teachings of U.S. Pat. No. 5,536,323 issued Jul. 16, 1996 in the names of Peter S. Kirlin, et al., and U.S. Pat. No. 5,711,816 issued Jan. 27, 1998 in the names of Peter S. Kirlin, et al., the disclosures of which are hereby incorporated herein by reference in their entirety.

The invention is described more fully hereinafter with reference to the formation of illustrative layered conductive oxide/Pt electrode structures, and with respect to the formation of alloyed electrode structures.

Multi-layered Electrodes

To form layered conductive electrode/Pt structures, a two step CVD process is utilized. First, either Pt or the conductive oxide is deposited followed by the remaining layer in the pair. After deposition of the PZT layer, the process is reversed to make a symmetrical electrode. In some instances, an asymmetrical electrode is desired. Here, the same order used to make the lower electrode would be used for the upper electrode.

The control of composition of complex oxides requires the use of a liquid delivery approach to MOCVD. Several examples of liquid delivery MOCVD processes to produce layered electrodes are described below.

Pt

A wide variety of CVD precursors currently exist for Pt CVD. In general terms, the use of trimethyl (cyclopentadienyl) Pt (IV), trimethyl (β-diketonate) Pt (IV), bis (β-diketonate) Pt (II), tetrakis (trfluorophosphine) Pt (0) are the preferred sources for both bubbler and liquid delivery approaches. For fast growth rates in bubbler, the trifluorophosphine complex is strongly preferred and exhibits a vapor pressure of >12 Torr at room temperature. High purity platinum can be deposited, but the trifluorophosphine is a toxic hemoglobin binder and its use therefore requires certain safety precautions. The other chemical precursors are viable candidates for low pressure CVD applications where thin film are acceptable. The thermal decomposition and deposition of Pt films using oxidizing co-reactants and environments is more fully described in copending application Ser. No. 08/673,372 filed Jun. 28, 1996 in the names of Thomas H. Baum et al., the disclosure of which hereby is incorporated herein by reference in its entirety.

Ir

The iridium precursor, as described in copending application Ser. No. 08/966,797 filed Nov. 10, 1997, the disclosure of which is hereby incorporated herein in its entirety, may for example comprise a Lewis base-stabilized β-diketonate iridium composition or a Lewis base-stabilized β-ketoiminate composition, of the formulae:

Lewis base stabilized Ir(I) β-diketonates of formula I:

wherein R and R' are the same or different and may be H, aryl, perfluoroaryl, $C_1$–$C_6$ alkyl, or $C_1$–$C_6$ perfluoroalkyl, and L is a coordinating Lewis base, preferably alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane, or Lewis base stabilized Ir(I) β-ketoiminates of formula II:

wherein R, R', and R" are the same or different, and are independently selected from the group consisting of H, aryl, perfluoroaryl, $C_1$–$C_6$ alkyl, or $C_1$–$C_6$ perfluoroalkyl, and L is a coordinating Lewis base, preferably selected from the group consisting of alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane.

For the Lewis base in the above precursors of formulae I and II, one or more Lewis base molecules may be preferred, especially for ether, alkene, alkyne, carbonyl and phosphine ligands. In some embodiments of precursors of formula II, R and R' may be identical and R" will be independently selected from the substituents listed above.

In CVD-based embodiments of the present invention, either a bubbler or organic solution liquid delivery can be utilized for the chemical vapor deposition of the Ir/IrO$_2$ thin film. The specific precursor may be suitably optimized for the delivery and transport of the precursor to the CVD reactor. The precursor is decomposed in the presence of an oxidant (e.g., O$_2$, O$_3$, or NO$_2$O) to preferentially deposit the metal Ir (<500° C.) or the oxide, IrO$_2$ (>550° C.). In some applications, the formation of a bi-layered Ir/IrO$_2$ film may be preferred.

RuO$_2$

Ruthenium compounds can be used to deposit both Ru and RuO$_2$. The bis(cyclopentadienyl) Ru and tris(tetramethyl-3,5-heptanedionate) Ru are viable precursors for CVD.

LaSrCoO$_3$

The liquid delivery CVD of LaSrCoO using β-diketonates of La(III), Sr (II), Co (II) may be carried out in an oxidizing environment. The concentrations in solution are selected to provide the correct film stoichiometry upon deposition. The use of Lewis base adducts, specifically polyamine adducts, are usefully employed for improved transport and delivery of each constituent (La, Co and Sr); this same chemical approach may be realized by modification of the solution mixtures. Other precursors of known molecular structure may also be used for these particular elements, such as cyclopentadienyl, β-ketoiminates and β-diiminates.

SrRuO$_3$

Liquid delivery MOCVD can be readily accomplished via the use of Sr(thd)2, and Ru(thd)3 mixtures. Both of these precursors have the demonstrated ability to thermally deposit their respective element. Modifications of the solution and/or precursor molecular structure can be utilized, as long as the modifications do not result in deleterious ligand exchange in solution or during vaporization. The use of oxidizing co-reactants, such as oxygen, ozone or nitrous oxide can facilitate the formation of oxides during thermal decomposition.

In order to efficiently deposit multilayer electrodes, either multiple deposition chambers or multiple liquid delivery systems are required. In the former method, a wafer is transferred between deposition chambers, preferably under vacuum, for deposition of each conductive layer. In the latter method, the precursor gas stream is toggled between vaporization systems and the deposition chamber.

Alloyed electrodes

Examples of CVD processes to deposit alloyed electrodes are given below:

The following can be deposited as metals and the oxidizable metal transformed to conductive oxide subsequently or can be deposited as metal and oxide using an oxidizing ambient.

Pt/Ir

Combinations of Pt and Ir complexes are applicable to the formation of alloys with controlled stoichiometries, as described in copending U.S. patent application Ser. No. 08/966,797 filed Nov. 10, 1997 in the names of Thomas H. Baum and Chong-Ying Xu, the disclosure of which is hereby incorporated herein by reference in its entirety.

Pd/Ir

Palladium bis(β-diketonates) are probably the preferred precursor for Pd alloy formation and can be used in tandem with Ir tris(β-diketonates) and Lewis base stabilized Ir(I) (β-diketonate). The use of forming gas is not required for metal film formation, but may be useful for extremely high-purity alloy formation.

Rh/Ir

Lewis base stabilized Rhodium(I) β-diketonates have been described in the literature as potential Rh metal sources for CVD film growth. The Lewis base complex can be matched to the Ir(I) complex for simultaneous delivery (via bubbling, liquid delivery and direct liquid injection).

Pd/Ru

Combinations of the above described materials could be used simultaneously, sequentially, or in independent steps to form the desired alloys. The following systems would be deposited as metal and oxide using an oxidizing ambient.

Pt/LSCO

A direct approach may be realized via the combined or sequential deposition of each element using Pt(II) β-diketonates and β-diketonates of La, Sr and Co with oxidizing co-reactants.

Pt/SrRuO3

A direct approach is the use of β-diketonates of Pt, Sr and Ru as described hereinabove.

The hybrid electrode structures of the invention thus may employ one or more compatible noble metals, alloyed, or sequentially deposited, with respect to a non-noble metal element that is relatively immiscible in the noble metal(s). Suitable non-noble metals include those having a tendency to oxidize to an electrically conductive oxides, such as Ir and Ru. Complex conductive oxides (LaSrCoO$_3$, SrRuO$_3$, indium tin oxide, and yttrium barium copper oxide may also be utilized in the broad practice of the invention. Oxidation of the oxidizable metal forming the conductive oxide may be carried out during the deposition process, or subsequent thereto, in an oxidizing ambient.

Figure 1:
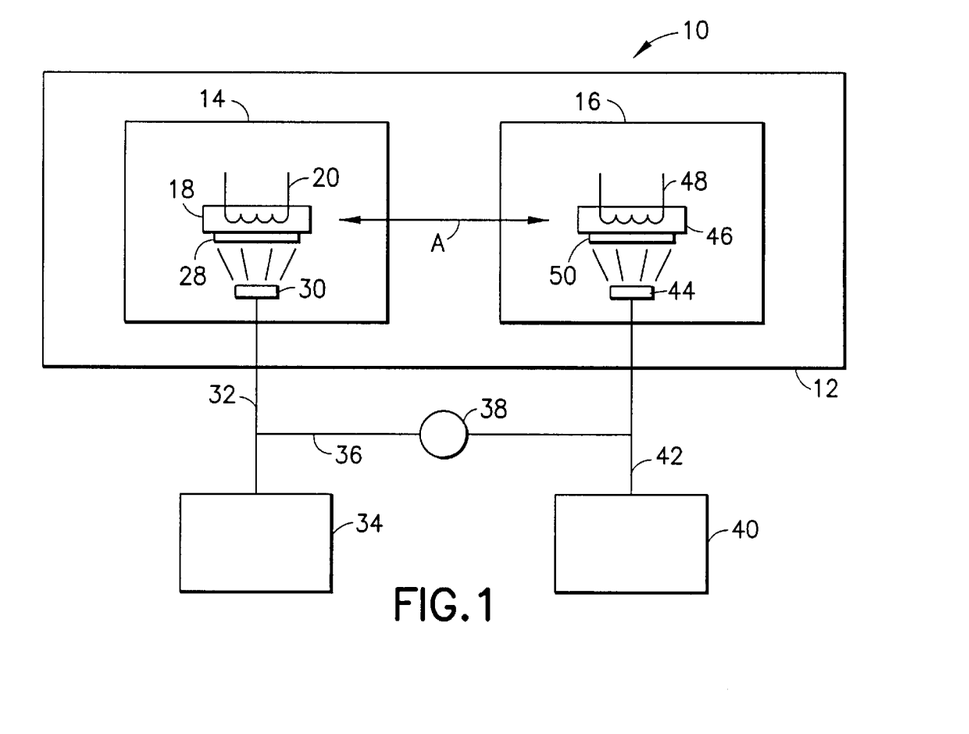
FIG. 1 is a schematic representation of a bubbler volatilization and chemical vapor deposition system wherein the hybrid electrodes of the invention can be formed, according to one embodiment of the invention.

FIG. 1 is a schematic representation of a bubbler volatilization and chemical vapor deposition system 10 wherein the hybrid electrodes of the invention can be formed, according to one embodiment of the invention.

The FIG. 1 system 10 includes a deposition chamber 12 which contains a first chemical vapor deposition chamber 14 and a second chemical vapor deposition chamber 16. Chamber 14 contains a susceptor 18 supporting wafer 28 thereon. The susceptor is heated by electrical resistance heating element 20. Alternatively, the susceptor may be heated by IR radiant energy, a heat exchange fluid passed through interior heat exchange passages in the susceptor, or in any other suitable manner.

The wafer 28 receives a flux of precursor vapor from the showerhead disperser 30 as shown. The showerhead 30 is fed by precursor vapor supply line 32, which is joined to bubbler 34. In the bubbler, a vapor stream is passed through the bubbler vessel in a conventional manner to provide a stream of the metalorganic source reagent vapor for deposition of the metal component of such vapor on the substrate wafer.

Subsequent to formation of the metal component on the substrate wafer in chemical vapor deposition chamber 14, the wafer 30 may be translated in the direction of the directional arrow A to the second chemical vapor deposition chamber 16.

In the second vapor deposition chamber 16, a second metal component is deposited over the first metal component deposited on the wafer in chemical vapor deposition chamber 14. A second heated susceptor 46 is shown in the second CVD chamber 16, heated by electrical resistance heating element 48. The wafer 50 on the susceptor 46 receives a flux of precursor vapor from showerhead disperser 44, which is supplied by precursor feed line 42. The precursor feed line 42 in turn is joined to the bubbler 40 holding the second metalorganic precursor, for volatilization thereof.

FIG. 1 shows the respective CVD chambers holding different wafers, and the wafers may be disposed on a carousel or other translation means (not shown) serving to motively transport a wafer from the first CVD chamber 14 to the second CVD chamber 16, with the wafer in CVD 16 concurrently being transported to the chamber 14.

In this manner the wafer receives in first CVD chamber 14 a coating of a first electrode metal on the wafer, followed in the second CVD chamber 16 with a coating of a second electrode metal, and vice versa (that is, the wafer initially in chamber 16 receives a first electrode metal coating on the wafer followed by a second metal coating in the chamber 14).

Alternatively, only a single wafer may be processed in sequence through a first one of the two CVD chambers 14 and 16, and thereafter in a second one of such chambers, or a wafer may receive repeated metal layer coatings thereon by shuttling back and forth between the chambers 14 and 16, in the direction indicated by the bidirectional arrow A, to provide a build-up of a series of alternating layers of the respective differing metals.

In this fashion, a layered hybrid electrode structure can be fabricated.

The FIG. 1 system 10 is also configured to permit the fabrication of hybrid alloy electrodes. As shown, the precursor feed lines 32 and 42 are interconnected by a manifold feed line 36 having flow control valve 38 therein.

By such expedient, the flow control valve can be modulated from a closed position permitting only separate flow of the respective metalorganic precursors through the respective lines 32 and 42, for layered hybrid electrode formation. However, if it is desired to produce an alloy hybrid electrode, as an alloy of the metal components supplied by the respective bubblers 34 and 40, the flow control valve 38 can be opened, to permit flow of metalorganic precursor from one of the bubblers to the feed line receiving the precursor vapor from the other bubbler. The valve 38 therefore is preferably a directional flow valve which permits flow from only one of the bubbler feed lines to the other feed line, at a given time. The valve may be switchable to allow flow in either direction, as part of a system having maximum process flexibility.

As a further embodiment for deposition of a layered electrode structure, a single deposition chamber may be employed to which the respective metalorganic precursors are cyclically alternatingly and repetitively introduced into the deposition chamber, to thereby build up a multilayered electrode structure comprising constituent alternating layers deriving from the alternatingly fed precursor streams.

Figure 2:
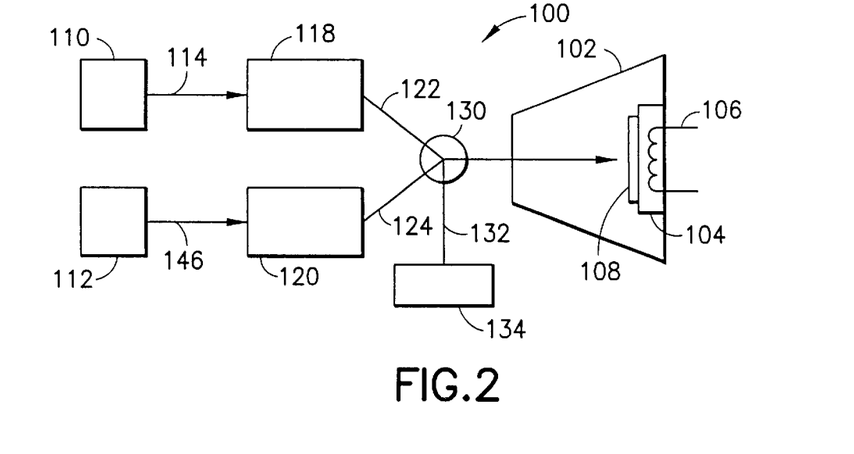
FIG. 2 is a schematic representation of a liquid delivery volatilization and chemical vapor deposition system wherein the hybrid electrodes of the invention can be formed, according to another embodiment of the invention.

FIG. 2 is a schematic representation of a liquid delivery volatilization and chemical vapor deposition system 100 wherein the hybrid electrodes of the invention can be formed, according to another embodiment of the invention.

In the FIG. 2 system, the chemical vapor deposition chamber 102 contains a heated susceptor 104 therein, which is heated by heating element 106. A wafer 108 is mounted on the susceptor and heated to appropriate temperature to cause deposition on the wafer of the desired composite metal alloy components, which form the alloy on the substrate wafer surface.

The CVD chamber 102 receives a first precursor vapor containing a first metal component by flow of metalorganic liquid source reagent from the supply vessel 110 therefor, in line 114, to the liquid delivery vaporizer unit 118, in which the liquid reagent from supply vessel 110 is flash vaporized to form the first precursor vapor.

Concurrently, a second metalorganic liquid source reagent vapor is flowed from supply vessel 112 in line 116 to the liquid delivery flash vaporization unit 120 where the liquid is flash vaporized to provide the second precursor vapor.

The first precursor vapor flows in line 122 to the mixing valve 130, where it is blended in an appropriate stoichiometric proportion with the second precursor vapor from line 124. The mixing valve 130 may for this purpose of selectively varying the proportions of the first and second precursor vapors, be selectively adjustable, by means of valve adjustment actuator 134 which is operated to transmit a control signal in signal transmission line 132 to the mixing valve 130 for adjustment to provide the proper proportions desired for the first and second precursor vapors.

The combined precursor vapor then is discharged from the mixing valve 130 as shown and is flowed into the chemical vapor deposition chamber 102, for deposition of the alloy metal components on the substrate wafer in the desired stoichiometric amounts.

The system shown in FIG. 2 may also be selectively operated to provide graded electrode layers wherein the alloy composition is varied along the thickness of the electrode film, by corresponding adjustment of the mixing valve 130.

The system schematically shown in FIG. 2 may be constructed as more fully described in U.S. patent application Ser. No. 08/758,599 filed Nov. 27, 1996 in the names of Jeffrey Roeder and Peter Van Buskirk, for "MULTIPLE VAPORIZER REAGENT SUPPLY SYSTEM FOR CHEMICAL VAPOR DEPOSITION UTILIZING DISSIMILAR PRECURSOR COMPOSITIONS," the disclosure of which is hereby incorporated herein in its entirety.

Figure 3:
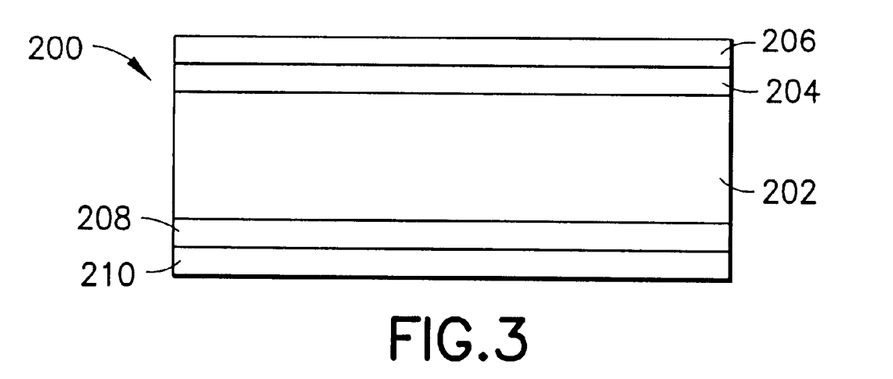
FIG. 3 is a schematic representation of a ferroelectric device structure according to one embodiment of the present invention, including a hybrid layered electrode on each of the top and bottom faces of the ferroelectric material.

FIG. 3 is a schematic representation of a ferroelectric device structure 200 according to one embodiment of the present invention, including a hybrid layered electrode on each of the top and bottom faces of the ferroelectric material 202.

The electrode structure may be way of example include a layer 204 of a conductive oxide material on the top face of the ferroelectric material, and a layer 208 of a same or different conductive oxide material on the bottom face of the ferroelectric material. The outermost layers 206 and 210 of the electrode structure may for example be composed of platinum. Reverse arrangements of the layers of the electrode structure are also possible and usefully employed.

Figure 4:
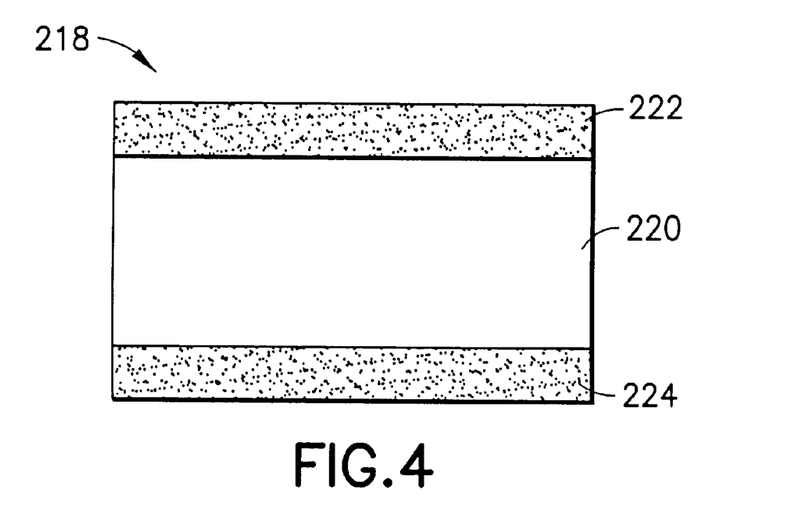
FIG. 4 is a schematic representation of a ferroelectric device structure according to one embodiment of the present invention, including a hybrid alloy electrode on each of the top and bottom faces of the ferroelectric material.

FIG. 4 is a schematic representation of a ferroelectric device structure 218 according to one embodiment of the present invention, including hybrid alloy electrodes 222, 224 on the top and bottom faces of the ferroelectric material 220, respectively. The electrode alloy composition may be homogeneous and isotropic throughout the electrode thickness, or the electrode may alternatively be graded or in other manner compositionally heterogeneous, depending on the method of formation of the electrodes.

The MOCVD method of formation of hybrid electrode structures on ferroelectric materials in the practice of the present invention achieves a substantial advantage over the ion-beam sputtering methodology of the prior art, in obtaining a superior extent of conformal deposition of the electrode structure, with a low rate of loss of remanent polarization in the structure after repeated switching cycles, and low rates of electrical leakage.

Accordingly, while the invention has been described herein with reference to specific features, aspects and embodiments, it will be recognized that the invention may be widely varied, and that numerous other variations, modifications and other embodiments will readily suggest themselves to those of ordinary skill in the art. Accordingly, the ensuing claims are to be broadly construed, as encompassing all such other variations, modifications and other embodiments, within their spirit and scope.

What is claimed is:

1. A method of fabricating a hybrid electrode structure for a ferroelectric device structure including a ferroelectric material, comprising the steps of:

vaporizing a first organometallic precursor for a first electrode metal component to form a first electrode component precursor vapor;

vaporizing a second organometallic precursor for a second electrode metal component to form a second electrode component precursor vapor; and depositing the first electrode component precursor vapor and the second electrode component precursor vapor by liquid delivery or bubbler delivery chemical vapor deposition for formation of said hybrid electrode structure, in a deposition mode selected from the group consisting of:

(I) simultaneous chemical vapor deposition of the first electrode metal component from the first electrode component precursor vapor and the second electrode metal component from the second electrode component precursor vapor, to yield an alloy hybrid electrode structure; and (II) sequential chemical vapor deposition of the first electrode metal component from the first electrode component precursor vapor and the second electrode metal component from the second electrode component precursor vapor, to yield a layered hybrid electrode structure including a first layer containing the first electrode metal component and a second layer containing the second electrode metal component;

wherein at least one of the first and second electrode metal components comprises a metal selected from the group consisting of platinum, palladium, cobalt, iridium, lanthanum and rhodium.

2. A method according to claim 1, wherein the hybrid electrode is formed by step (I).

3. A method according to claim 1, wherein the hybrid electrode is formed by step (II).

4. A method according to claim 1, wherein the ferroelectric material comprises a material selected from the group consisting of $Pb(Zr,Ti)O_3$, $(Pb,La)TiO_3$, $(Pb,La)(Zr,Ti)O_3$, $(Pb,Sr)(Zr,Ti)O_3$, and $SrBi_2(Ta,Nb)_2O_9$.

5. A method according to claim 1, wherein the ferroelectric material comprises $Pb(Zr,Ti)O_3$ or a derivative thereof.

6. A method according to claim 1, wherein the first organometallic and second organometallic precursors are different from but compatible with one another and are selected from the group consisting of:

Platinum precursors: trimethyl(cyclopentadienyl) Pt (IV), trimethyl(β-diketonate) Pt (IV), bis(β-diketonate) Pt (II), tetrakis(trfluorophosphine) Pt (0);

Cobalt precursors: β-diketonates, cyclopentadienyl compounds, β-ketoiminates and β-diiminates of Co (II);

Iridium precursors: a Lewis base-stabilized β-diketonate iridium composition or a Lewis base-stabilized β-ketoiminate composition, of the formulae:

Lewis base stabilized Ir(I) β-diketonates of formula I:

I wherein R and R' are the same or different and may be H, aryl, perfluoroaryl, $C_1$–$C_6$ alkyl, or $C_1$–$C_6$ perfluoroalkyl, and L is a coordinating Lewis base, preferably alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane, or Lewis base stabilized Ir(I) β-ketoiminates of formula II:

II wherein R, R', and R" are the same or different, and are independently selected from the group consisting of H, aryl, perfluoroaryl, $C_1$–$C_6$ alkyl, or $C_1$–$C_6$ perfluoroalkyl, and L is a coordinating Lewis base, preferably selected from the group consisting of alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane;

Ruthenium precursors bis(cyclopentadienyl) Ru and tris (tetramethyl-3,5-heptanedionate) Ru;

Lanthanum precursors: β-diketonates, cyclopentadienyl compounds, β-ketoiminates and β-diiminates of La(III);

Strontium precursors: β-diketonates, cyclopentadienyl compounds, β-ketoiminates and β-diiminates of Sr (II);

Cobalt precursors: β-diketonates, cyclopentadienyl compounds, β-ketoiminates and β-diiminates of Co (II);

Rhodium precursors: Rhodium(I) β-diketonates.

7. A method according to claim 1, wherein the first electrode metal component and the second electrode metal component comprise a metal pair selected from the group consisting of the following first metal and second metal pairs:

(i) Pt and Ir,
(ii) Pt and Ru,
(iii) Pd and Ir
(iv) Pd and Ru
(v) Rh and Ir, and
(vii) Rh and Ru.

8. A method according to claim 1, wherein a hybrid electrode structure is fabricated on each of different surfaces of the ferroelectric material.

9. A method according to claim 1, wherein one of said first and second electrode metal components comprises platinum and the precursor therefor comprises tetrakis (trifluorophosphine) platinum.

10. A method according to claim 1, wherein one of said first and second electrode metal components comprises iridium and the precursor therefor comprises a Lewis base stabilized Ir(I) β-diketonate.

11. A method according to claim 1, comprising deposition mode (I), wherein the alloy hybrid electrode structure is formed as a compositionally heterogeneous electrode structure.

12. A method according to claim 1, comprising deposition mode (I), wherein the alloy hybrid electrode structure is formed as a compositionally graded electrode structure.

13. A method according to claim 1, wherein one of the first and second electrode metal components comprises a noble metal and the other of said first and second electrode metal components comprises a non-noble metal element that is relatively immiscible in the noble metal.

14. A method according to claim 1, wherein said hybrid electrode structure comprises iridium.

15. A method according to claim 13, wherein the noble metal is selected from the group consisting of Pt, Pd, and Rh.

16. A method according to claim 13, wherein the non-noble metal is selected from the group consisting of Ir, Ru, La, Sr, Co, In, Sn, Y, Ba, and Cu.

17. A method according to claim 13, wherein the non-noble metal forms an oxide selected from the group consisting of $LaSrCoO_3$, $SrRuO_3$, indium tin oxide, and yttrium barium copper oxide.

18. A method according to claim 13, wherein the non-noble metal is oxidized in an oxidizing ambient during or subsequent to its deposition.

19. A method according to claim 14, wherein the organometallic precursor for iridium comprises at least one iridium precursor composition selected from the group consisting of:

(I) Lewis base stabilized Ir(I) β-diketonates of formula I:

wherein R and R' are the same or different and may be H, aryl, perfluoroaryl, $C_1$–$C_6$ alkyl, or $C_1$–$C_6$ perfluoroalkyl, and L is a coordinating Lewis base, preferably alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane, and (II) Lewis base stabilized Ir(I) β-ketoiminates of formula II:

wherein R, R', and R" are the same or different, and are independently selected from the group consisting of H, aryl, perfluoroaryl, $C_1$–$C_6$ alkyl, or $C_1$–$C_6$ perfluoroalkyl, and L is a coordinating Lewis base, preferably selected from the group consisting of alkene, diene, cycloalkene, cyclodiene, cyclooctatetraene, alkyne, substituted alkyne (symmetrical or asymmetrical), amine, diamine, triamine, tetraamine, ether, diglyme, triglyme, tetraglyme, phosphine, carbonyl, dialkyl sulfide, vinyltrimethylsilane, and allyltrimethylsilane.

20. A method according to claim 14, wherein said hybrid electrode structure comprises an alloy composition of iridium with at least one of platinum and palladium.

21. A method according to claim 1, wherein said hybrid electrode structure comprises an alloy composition, and said precursors are concurrently vaporized in respective separate liquid delivery systems to form said first electrode component precursor vapor and said second electrode component precursor vapor.

22. A method of forming a hybrid electrode for a ferroelectric capacitor on a substrate, wherein the hybrid electrode includes discrete sequential layers of different metals, said method comprising bubbler delivery MOCVD or liquid delivery MOCVD of said metals from respective precursors therefor, wherein each of the respective precursors is flowed to a respective different one of multiple deposition chambers and wherein the substrate is transferred between said deposition chambers for deposition of said different metals to form said hybrid electrode.

* * * * *